United States Patent
Liu et al.

(10) Patent No.: US 9,890,084 B2
(45) Date of Patent: *Feb. 13, 2018

(54) HYBRID NANOCOMPOSITE COATINGS AND APPLICATIONS THEREOF

(71) Applicant: Kennametal Inc., Latrobe, PA (US)

(72) Inventors: Zhenyu Liu, Greensburg, PA (US); Peter Rudolf Leicht, Latrobe, PA (US); Yixiong Liu, Greensburg, PA (US)

(73) Assignee: KENNAMETAL INC., Latrobe, PA (US)

(*) Notice: Subject to any disclaimer, the term of this patent is extended or adjusted under 35 U.S.C. 154(b) by 72 days.

This patent is subject to a terminal disclaimer.

(21) Appl. No.: 14/872,802

(22) Filed: Oct. 1, 2015

(65) Prior Publication Data

US 2017/0096372 A1 Apr. 6, 2017

(51) Int. Cl.
*C23C 16/30* (2006.01)
*C04B 35/117* (2006.01)
(Continued)

(52) U.S. Cl.
CPC .......... *C04B 35/117* (2013.01); *B23B 27/148* (2013.01); *C04B 35/62222* (2013.01);
(Continued)

(58) Field of Classification Search
USPC .......... 51/307, 309; 428/216, 325, 336, 697, 428/698, 699, 701, 702
See application file for complete search history.

(56) References Cited

U.S. PATENT DOCUMENTS 4,284,687 A * 8/1981 Dreyer .................. B23B 27/148
428/336
4,599,281 A * 7/1986 Schintlmeister ...... C23C 30/005
428/701
(Continued)

FOREIGN PATENT DOCUMENTS

DE 311460 A * 9/1982
EP 709483 B1 * 4/2002
(Continued)

OTHER PUBLICATIONS

Musil, J., Hard Nanocomposite Coatings: Thermal Stability, Oxidation Resistance and Toughness, Surface & Coatings Technology 207 (2012), pp. 50-65.
(Continued)

*Primary Examiner* — Archene Turner
(74) *Attorney, Agent, or Firm* — Larry R. Meenan

(57) ABSTRACT

In one aspect, articles are described herein comprising refractory coatings employing alumina-based hybrid nanocomposite architectures. A coated article described herein comprises a substrate and a coating deposited by CVD adhered to the substrate, the coating including a composite refractory layer having a matrix phase comprising alumina and at least one particulate phase within the matrix phase, the particulate phase comprising nanoscale to submicron particles formed of at least one of an oxycarbide and oxycarbonitride of one or more metals selected from the group consisting of aluminum and Group IVB metals.

30 Claims, 13 Drawing Sheets

(51) Int. Cl.
*B23B 27/14* (2006.01)
*C04B 37/00* (2006.01)
*C04B 35/622* (2006.01)
*C23C 28/04* (2006.01)

(52) U.S. Cl.
CPC ............ *C04B 37/006* (2013.01); *C23C 16/30* (2013.01); *C23C 28/04* (2013.01); *C23C 28/042* (2013.01); *B23B 2222/16* (2013.01); *B23B 2222/28* (2013.01); *B23B 2226/125* (2013.01); *B23B 2228/04* (2013.01); *C04B 2235/3817* (2013.01); *C04B 2235/3856* (2013.01); *C04B 2235/5445* (2013.01); *C04B 2235/5454* (2013.01); *C04B 2235/781* (2013.01); *C04B 2235/785* (2013.01); *C04B 2237/121* (2013.01); *C04B 2237/122* (2013.01)

(56) References Cited

U.S. PATENT DOCUMENTS

| | | | |
|---|---|---|---|
| 4,714,660 A | 12/1987 | Gates, Jr. | |
| 6,284,356 B1* | 9/2001 | Kiriyama | C23C 30/005 428/697 |
| 7,455,900 B2* | 11/2008 | Ruppi | C04B 41/009 428/701 |
| 7,455,918 B2* | 11/2008 | Gates, Jr. | C23C 16/0272 428/698 |
| 2002/0176755 A1 | 11/2002 | Ruppi | |
| 2007/0298232 A1 | 12/2007 | McNerny et al. | |
| 2008/0050614 A1* | 2/2008 | Holzschuh | C23C 30/005 428/698 |
| 2008/0240876 A1 | 10/2008 | Elkouby et al. | |
| 2016/0160347 A1* | 6/2016 | Liu | C23C 16/44 428/336 |

FOREIGN PATENT DOCUMENTS

| | | |
|---|---|---|
| JP | 04-256503 A1 * | 9/1992 |
| JP | 04-289002 A1 * | 10/1992 |
| JP | 2005-279825 A1 * | 10/2013 |
| KR | 20100135641 A | 12/2010 |

OTHER PUBLICATIONS

Lukaszkowicz, Krzysztof, Review of Nanocomposite Thin Films and Coatings Deposited by PVD and CVD Technology, www.intechopen.com, pp. 145-162.

Daniel, Rostislav et al., Novel Nanocomposite Coatings, Advances and Industrial Applications.

Cavaleiro, Albano et al., Nanostructured Coatings, Nanostructure Science and Technology.

* cited by examiner

HYBRID NANOCOMPOSITE COATINGS AND APPLICATIONS THEREOF

FIELD

The present invention relates to refractory coatings and, in particular, to refractory coatings deposited by chemical vapor deposition (CVD) for cutting tool applications.

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multi-layer constructions of the foregoing refractory materials have increasingly reached their performance limits, thereby calling for the development of new coating architectures for cutting tools.

SUMMARY

In one aspect, articles are described herein comprising refractory coatings employing alumina-based hybrid nanocomposite architectures. Briefly, a coated article described herein comprises a substrate and a coating deposited by CVD adhered to the substrate, the coating including a composite refractory layer having a matrix phase comprising alumina and at least one particulate phase within the matrix phase, the particulate phase comprising nanoscale (<100 nm) to submicron particles formed of at least one of an oxycarbide and oxycarbonitride of one or more metals selected from the group consisting of aluminum and Group IVB metals. The particles can be dispersed throughout the matrix phase. In some embodiments, for example, the particles can exhibit periodic spacing, aperiodic spacing or patterned distribution in the matrix phase. Additionally, the composite refractory layer can further comprise titanium-containing nanoscale ribbon structures. In some embodiments, such nanoscale ribbon structures are crystalline and have at least one dimension ranging from 1 nm to 100 nm.

These and other embodiments are described further in the detailed description which follows.

DETAILED DESCRIPTION

Figure 1:
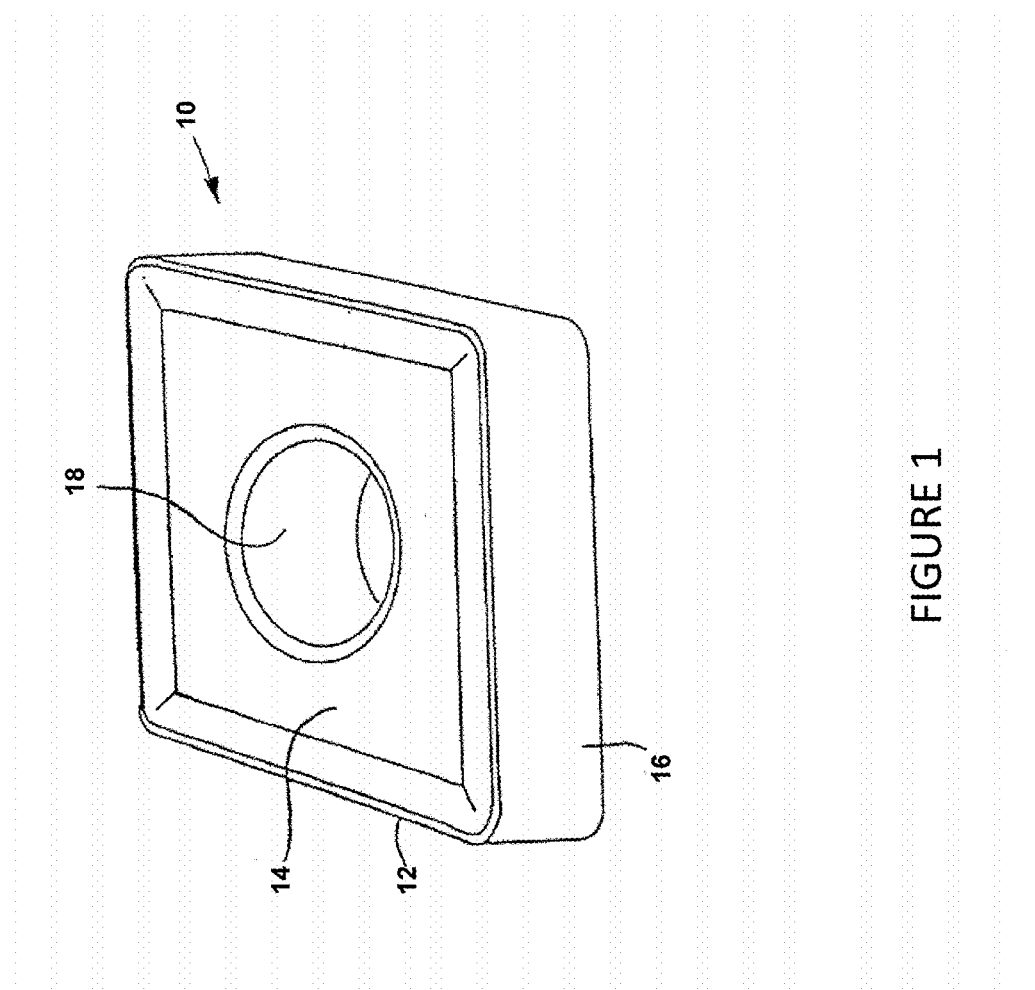
FIG. 1 illustrates a cutting tool substrate according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

In one aspect, articles are described herein comprising refractory coatings employing alumina-based hybrid nanocomposite architectures. Articles having such refractory coatings, in some embodiments, are suitable for high wear and/or abrasion applications, including metal cutting operations. A coated article described herein comprises a substrate and a coating deposited by CVD adhered to the substrate, the coating including a composite refractory layer having a matrix phase comprising alumina and at least one particulate phase within the matrix phase, the particulate phase comprising nanoscale to submicron particles formed of at least one of an oxycarbide and oxycarbonitride of one or more metals selected from the group consisting of aluminum and Group IVB metals. Additionally, the composite refractory layer can further comprise titanium-containing nanoscale ribbon structures. In some embodiments, such nanoscale ribbon structures are crystalline and have at least one dimension ranging from 1 nm to 100 nm. As illustrated in the microscopy images provided herein, the nanoscale ribbon structures can exhibit a 2-dimensional morphology.

Turning now to specific components, coated articles described herein comprise a substrate. A coated article can comprise any substrate not inconsistent with the objectives of the present invention. For example, a substrate can be a cutting tool or tooling used in wear applications. Cutting tools include, but are not limited to, indexable cutting inserts, end mills or drills. Indexable cutting inserts can have any desired ANSI standard geometry for milling, interrupted cut or turning applications. Substrates of coated articles described herein can be formed of cemented carbide, carbide, ceramic, cermet, polycrystalline cubic boron nitride, steel or other alloy. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

A cutting tool substrate can comprise one or more cutting edges formed at the juncture of a rake face and flank face(s) of the substrate. FIG. 1 illustrates a cutting insert substrate according to one embodiment described herein. As illustrated in FIG. 1, the substrate (10) has cutting edges (12) formed at junctions of the substrate rake face (14) and flank faces (16). The substrate (10) also comprises an aperture (18) for securing the substrate (10) to a tool holder.

As described herein, a coating adhered to the substrate includes a composite refractory layer having a matrix phase comprising alumina ($Al_2O_3$) and at least one particulate phase within the matrix phase, the particulate phase comprising nanoscale to submicron particles formed of at least one of an oxycarbide and oxycarbonitride of one or more metals selected from the group consisting of aluminum and Group IVB metals. Groups of the Periodic Table described herein are identified according to the CAS designation, where Group IVB includes titanium, zirconium and hafnium. Particles of the particulate phase can generally have a diameter of 5 nm to 800 nm and exhibit a crystalline structure. In some embodiments, particles of the particulate phase have a diameter selected from Table I.

TABLE I

| Crystalline Particle Diameter (nm) |
|---|
| ≤100 |
| 50-500 |
| 25-300 |
| 1-100 |

Particles of the particulate phase can exhibit a generally spherical shape, elliptical shape or rod-like shape. In some embodiments, the particles can have a rice-like shape or irregular shape. Moreover, particle shape can be substantially uniform throughout the refractory layer. Alternatively, particle shape can vary in the refractory layer.

Particles of the particulate phase can have any desired distribution in the alumina matrix phase, including substantially uniform as well as heterogeneous distributions. In some embodiments, the particles can exhibit periodic spacing or aperiodic spacing in the alumina matrix phase. For example, periodic spacing of the particles can range from 20 nm to 2 μm in some embodiments. Moreover, particles can also exhibit a patterned distribution in the alumina matrix phase.

Compositional identity of the nanoscale to submicron particles of the particulate phase can be uniform or substantially uniform throughout the refractory layer. Alternatively, compositional identity of the particles can be varied throughout the refractory layer. For example, Group IVB metal(s) of the oxycarbide and/or oxycarbonitride particles can be varied along the thickness of the refractory layer. When varied, the Group IVB metals can present any desired pattern in the particulate phase, such as alternating or periodic distribution along thickness of the refractory layer. Variance in the Group IVB metals can also be random throughout the refractory layer. Additionally, the non-metallic component of the particles can vary along the thickness of the refractory layer. In some embodiments, the oxycarbide and oxycarbonitride non-metallic component can exhibit any desired pattern, including alternating or periodic distribution along the thickness of the refractory layer. The non-metallic component can also have a random distribution. The ability independently vary metallic (Ti, Zr, Hf, Al) components and non-metallic (OC, OCN) components of the particulate phase across the thickness of the refractory layer permits freedom of design to meet a variety of wear applications and environments.

As described herein, the composite refractory layer can further comprise titanium-containing nanoscale ribbon structures. In some embodiments, such nanoscale ribbon structures are crystalline and have at least one dimension ranging from 1 nm to 100 nm. The nanoscale ribbon structures can be dispersed throughout the alumina matrix. Distribution of the nanoscale ribbon structures can be periodic, aperiodic or patterned in the composite refractory layer. Further, the nanoscale ribbon structures can exhibit a uniform composition or varied composition in the composite refractory layer. For example, the nanoscale ribbon structures, in some embodiments, are formed of at least one of titanium oxycarbide, titanium oxycarbonitride, titanium aluminum oxycarbide and titanium aluminum oxycarbonitride. Together with the nanoscale to submicron particulate phase, the nanoscale ribbon structures provide reinforcement of the alumina matrix, thereby impacting the one or more properties of the composite refractory layer such as strength, hardness, toughness and friction behavior.

Depending on CVD conditions, the alumina matrix phase can be α-alumina, κ-alumina or mixtures (α/κ) thereof. In some embodiments, the reinforcing particulate phase and/or nanoscale ribbon structures terminate alumina grain growth leading to refinement of alumina matrix grains. For example, termination of grain growth can restrict alumina grain size to submicron or nanoscale in one or more dimensions. In some embodiments, alumina grains of the matrix have a diameter selected from Table II.

TABLE II

| Alumina Grain Diameter (nm) |
|---|
| 50-800 |
| 75-500 |
| 100-300 |

Moreover, grains of the alumina matrix can exhibit a columnar morphology. In some embodiments, the alumina matrix phase further comprises Group IVB metal dopant. Such metal dopant can be incorporated into the alumina grains.

Figure 2:
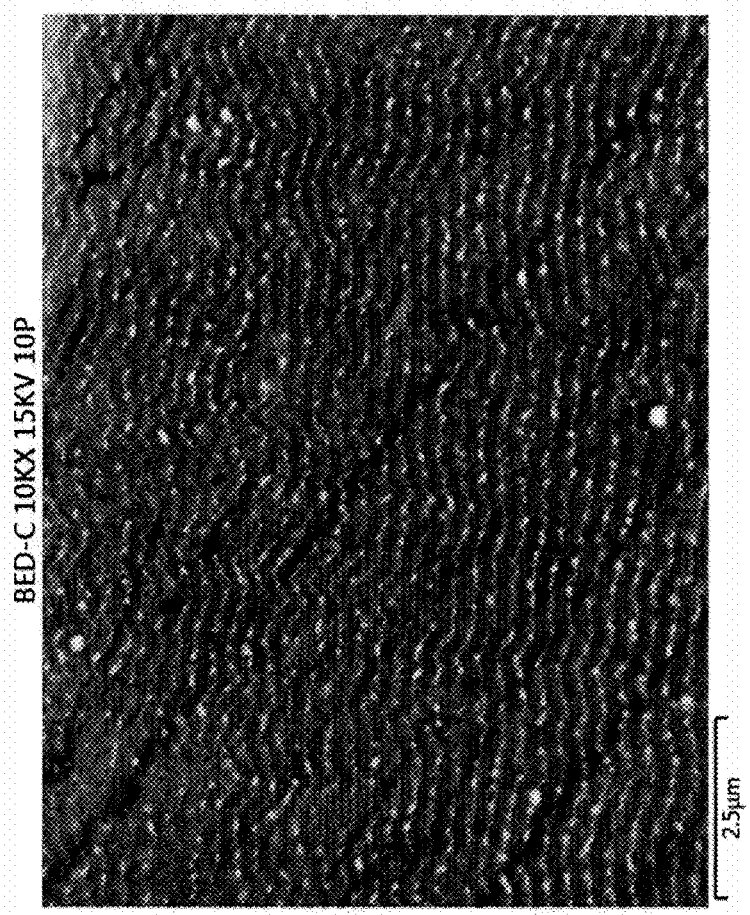
FIG. 2 is a scanning electron microscopy (SEM) image of a section of a composite refractory layer according to some embodiments described herein.
Figure 3:
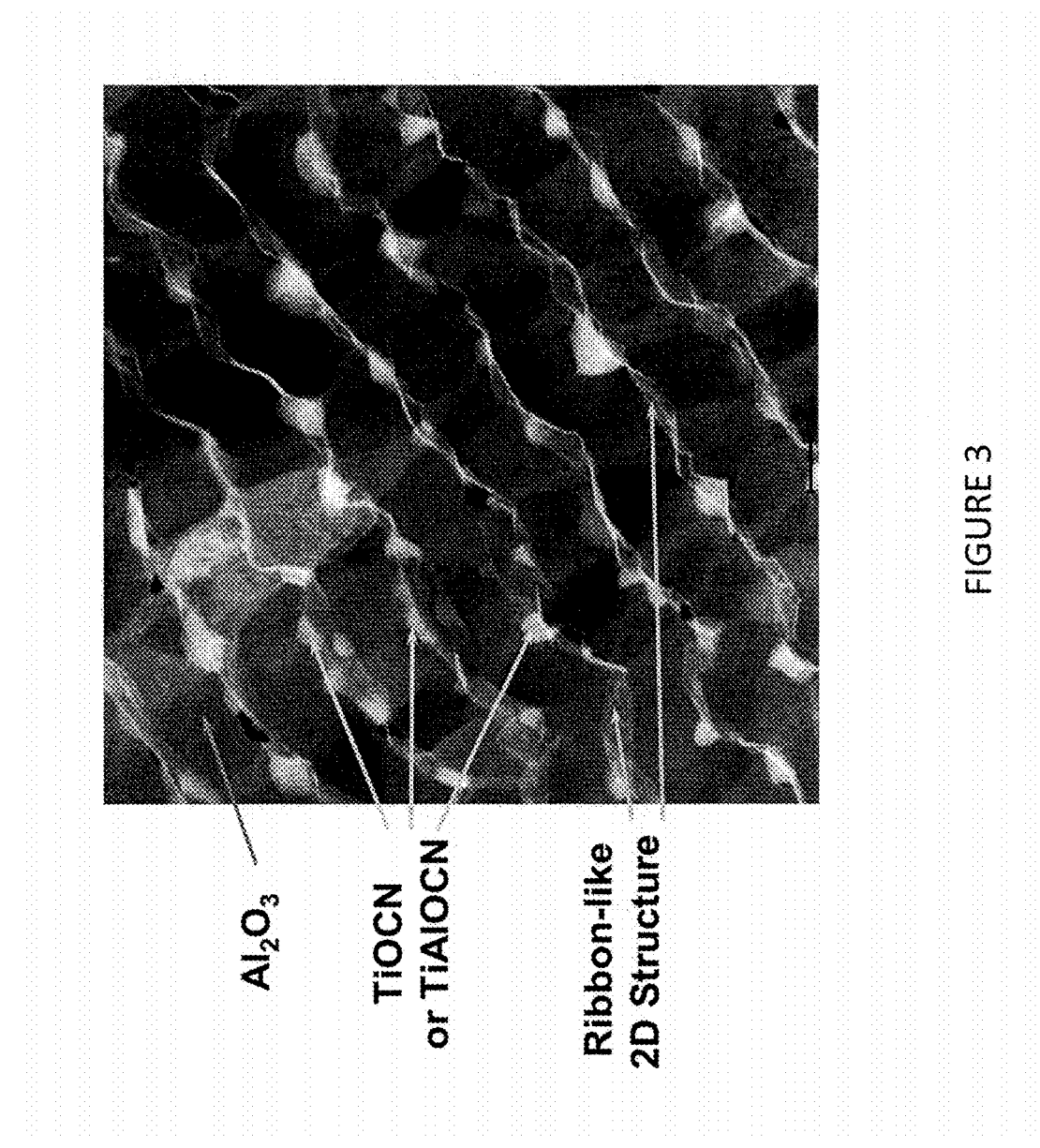
FIG. 3 is a scanning transmission electron microscopy (STEM) image of a section of a composite refractory layer according to some embodiments described herein.

FIG. 2 is an SEM of a section of a composite refractory layer according to some embodiments described herein. As illustrated in FIG. 2, nanoscale to submicron particles (white) are uniformly or substantially uniformly dispersed throughout the alumina matrix (gray), the particles formed of at least one of an oxycarbide and oxycarbonitride of one or more metals selected from the group consisting of aluminum and Group IVB metals. Closer examination provided by the STEM image of FIG. 3 reveals the presence of nanoscale ribbon structures in the alumina matrix in addition to the nanoscale particles.

Figure 4:
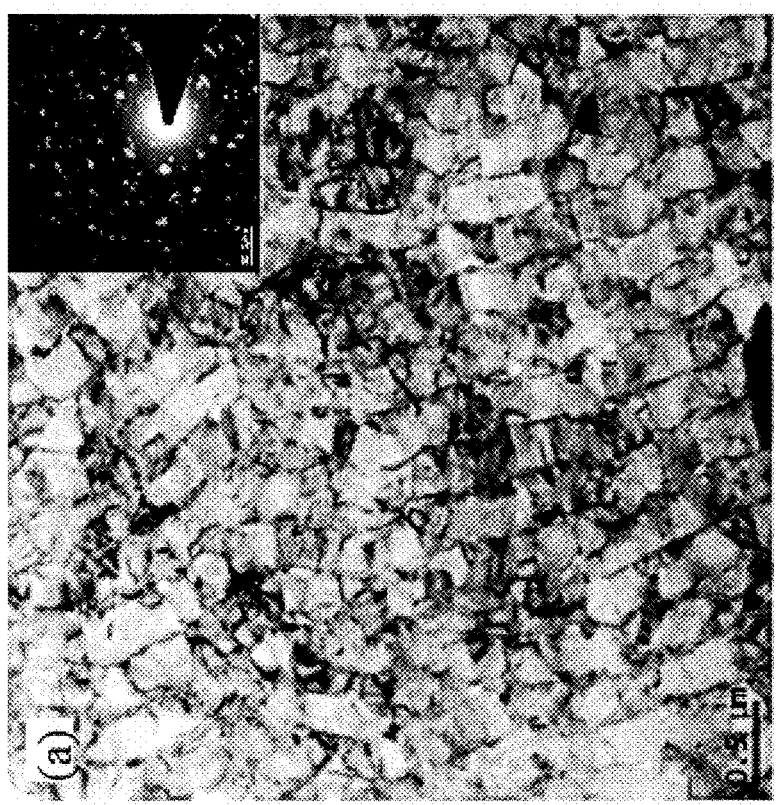
FIG. 4(a) is a bright field transmission electron microscopy (TEM) image of a section of a composite refractory layer according to some embodiments described herein with the inset being a selected area electron diffraction (SAED) illustrating polycrystalline morphology of the layer.
FIG. 4(b) is the corresponding dark field TEM image of the composite refractory layer of FIG. 4(a).
FIG. 4(c) is a TEM image showing dimensions of an individual columnar grain of a composite refractory layer according to one embodiment described herein.
FIG. 4(d) is convergent beam electron diffraction (CBED) of the columnar grain of FIG. 4(c).
Figure 4:
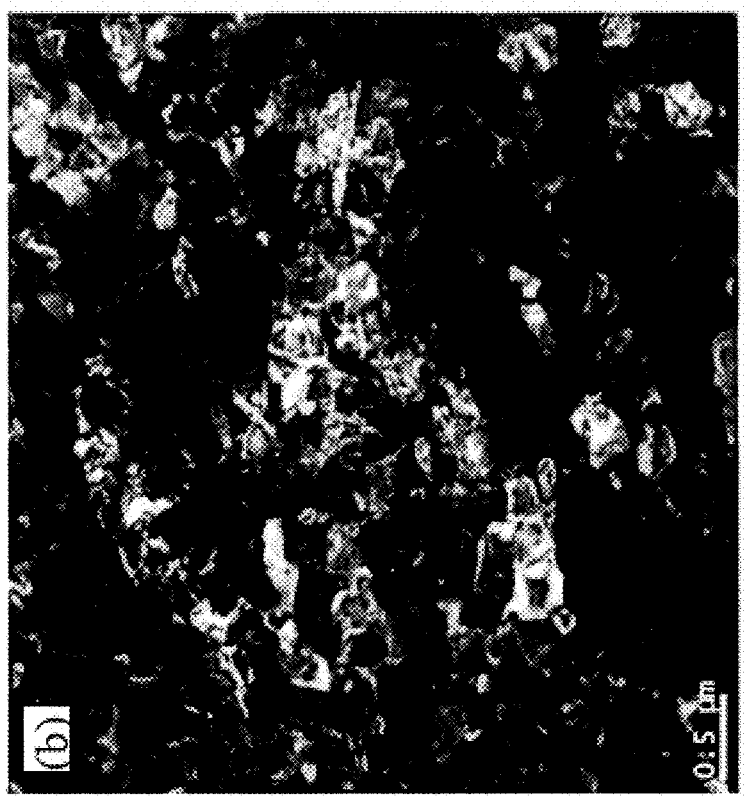
Figure 4:
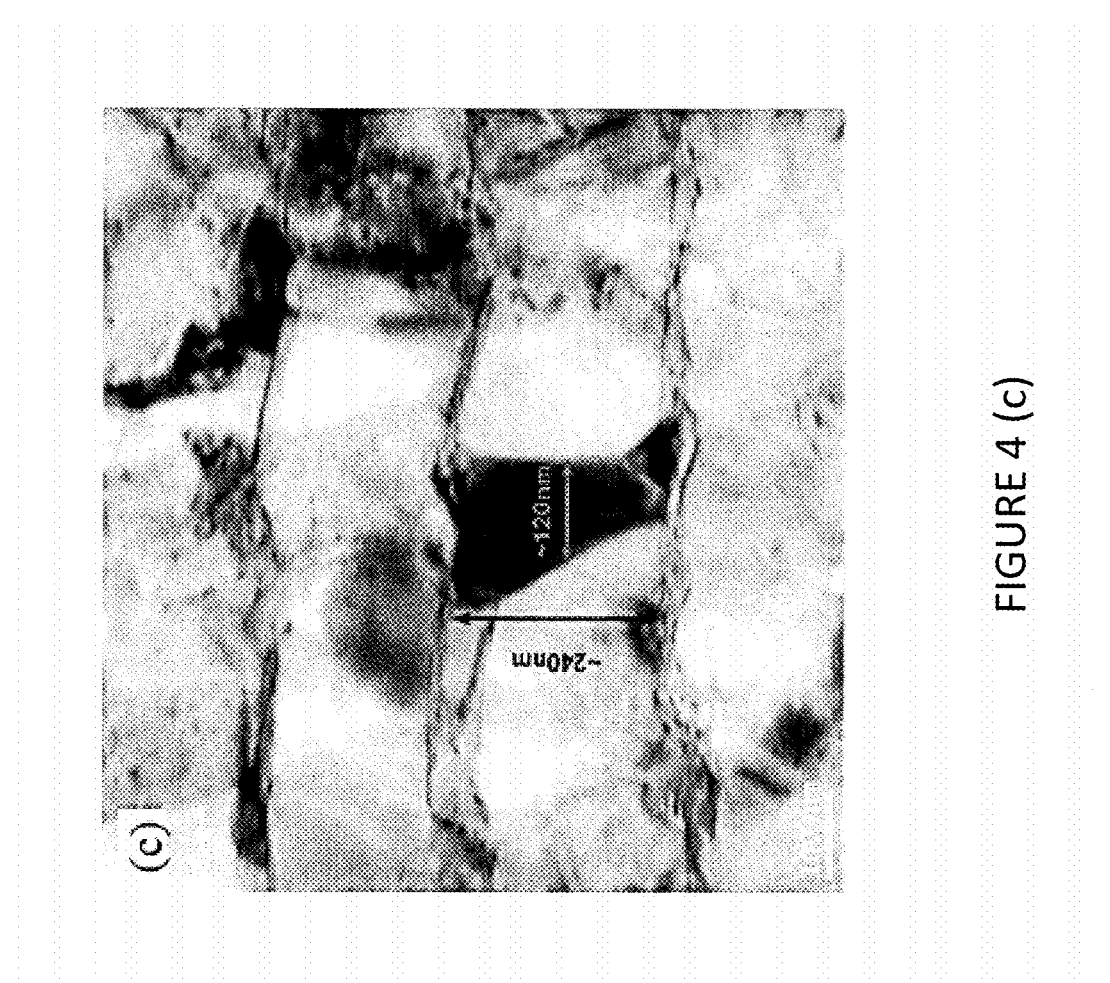
Figure 4:
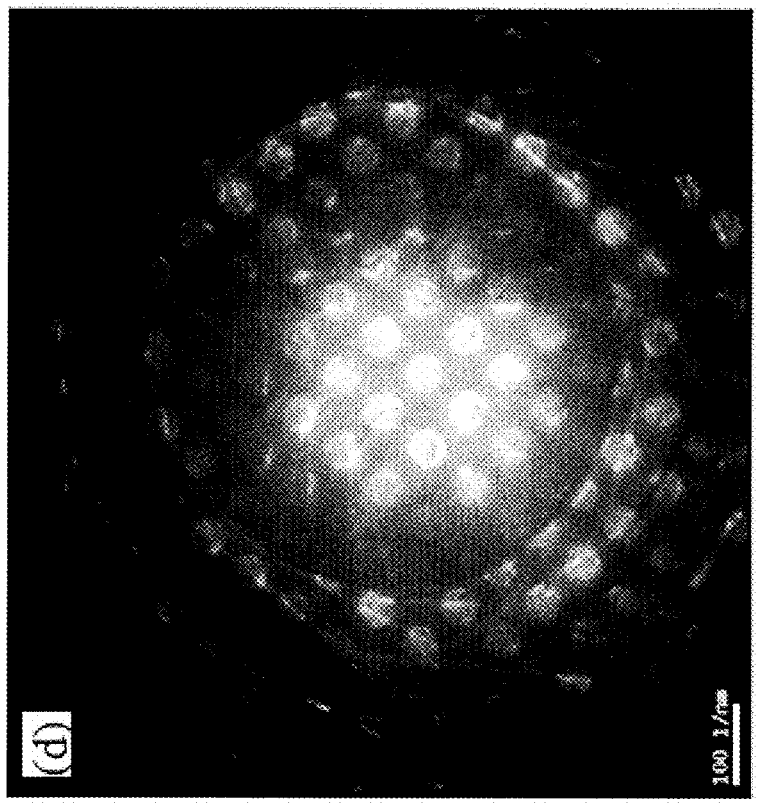

Regarding the alumina matrix, FIG. 4(a) is a bright field TEM image of a section of a composite refractory layer showing the crystalline grain structure. The inset of FIG. 4(a) is an SAED pattern exhibiting the polycrystalline morphology of the composite refractory layer. FIG. 4(b) is the corresponding dark field TEM image of the composite refractory layer of FIG. 4(a), further illustrating alumina grains on the nanoscale. Alumina grain morphology is illustrated in the TEM of FIG. 4(c). The individual alumina grain of FIG. 4(c) is columnar having width of about 120 nm and height of 240 nm. FIG. 4(d) is convergent beam electron diffraction (CBED) of the columnar grain of FIG. 4(c).

Figure 5:
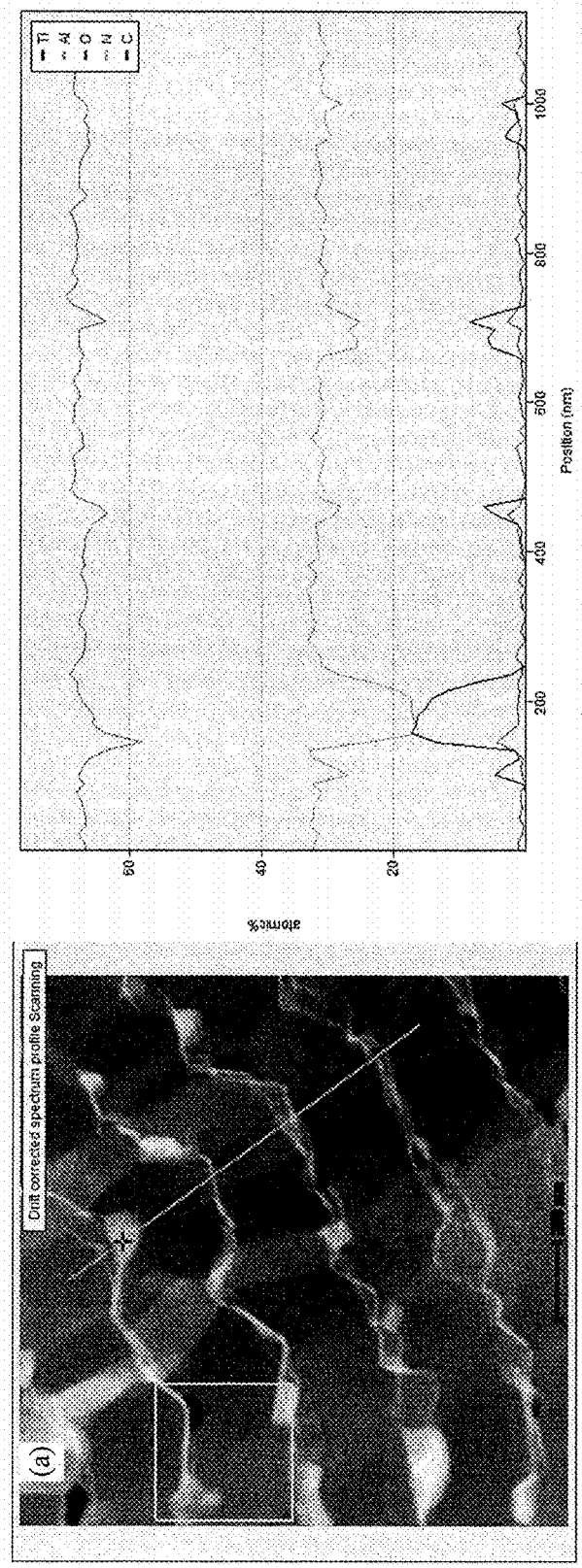
FIG. 5(a) is an energy dispersive spectroscopy (EDS) line profile of a section of a composite refractory layer according to one embodiment described herein
FIG. 5(b) is an EDS spot analysis of a nanoparticle in the matrix phase of the composite refractory layer.
FIG. 5(c) is an EDS spot analysis of the $Al_2O_3$ matrix of the composite refractory layer according to one embodiment described herein.
FIG. 5(d) is an EDS spot analysis of a nanoscale ribbon structure of the composite refractory layer according to one embodiment described herein.
Figure 5:
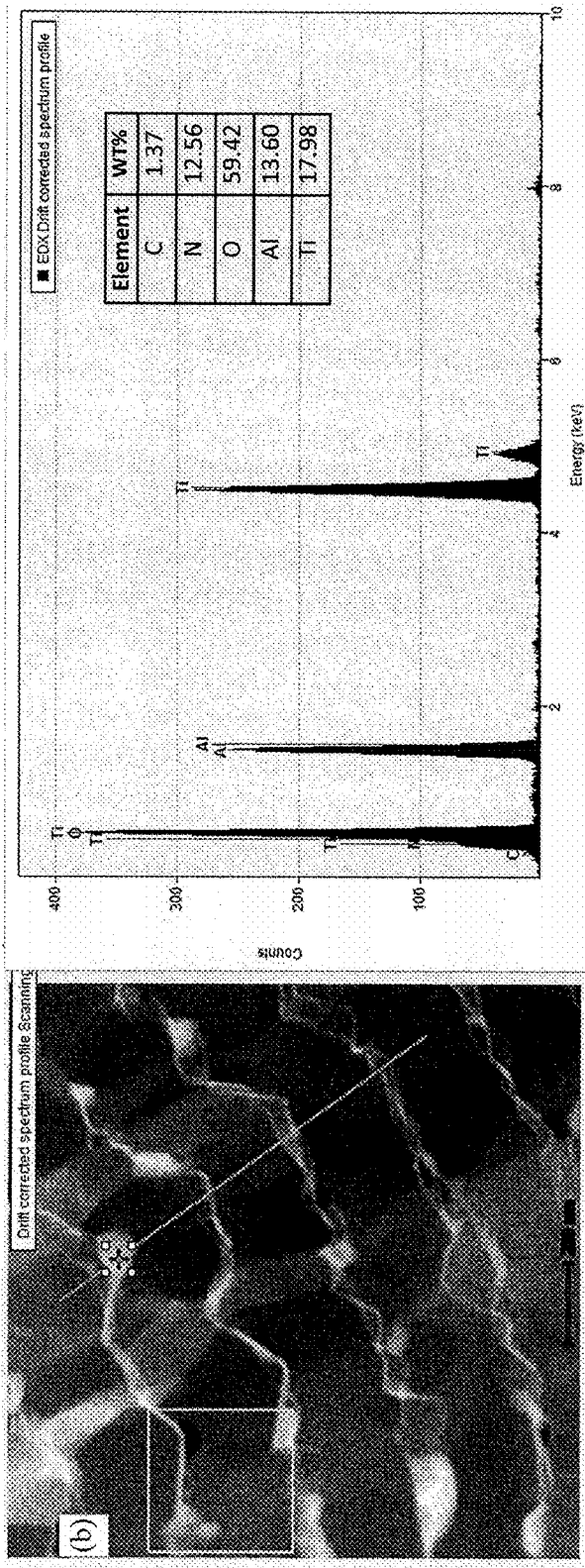
Figure 5:
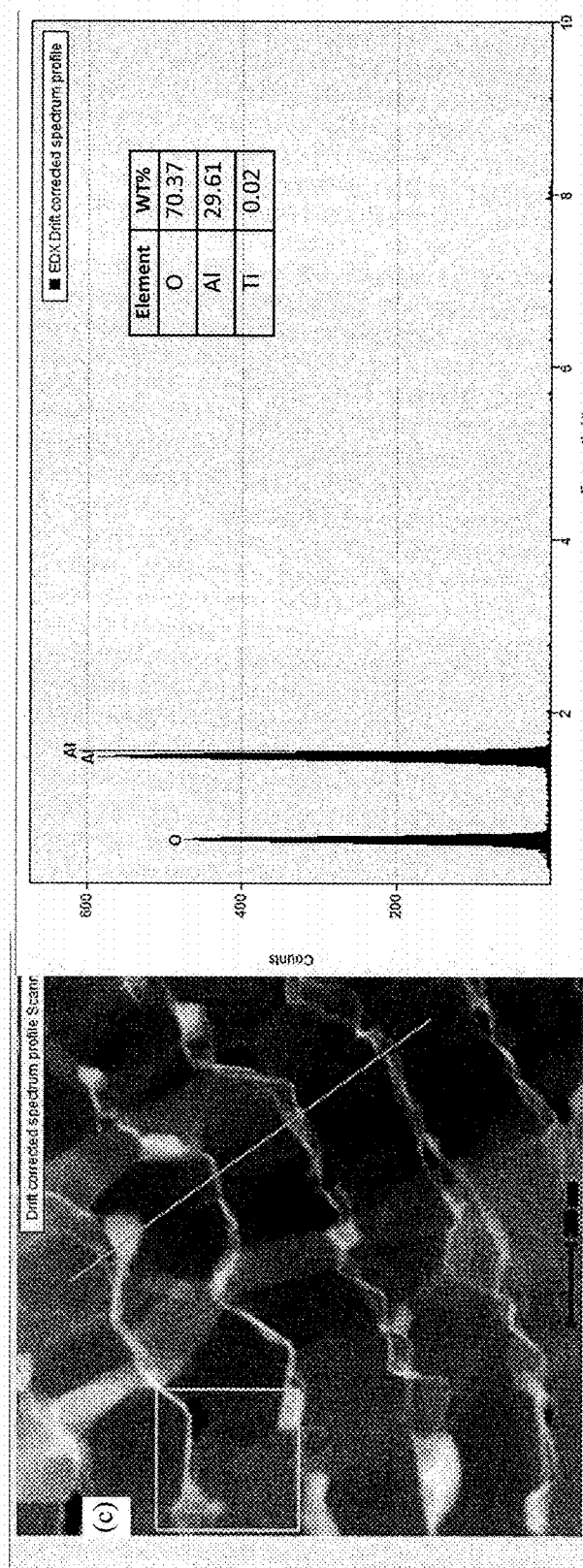
Figure 5:
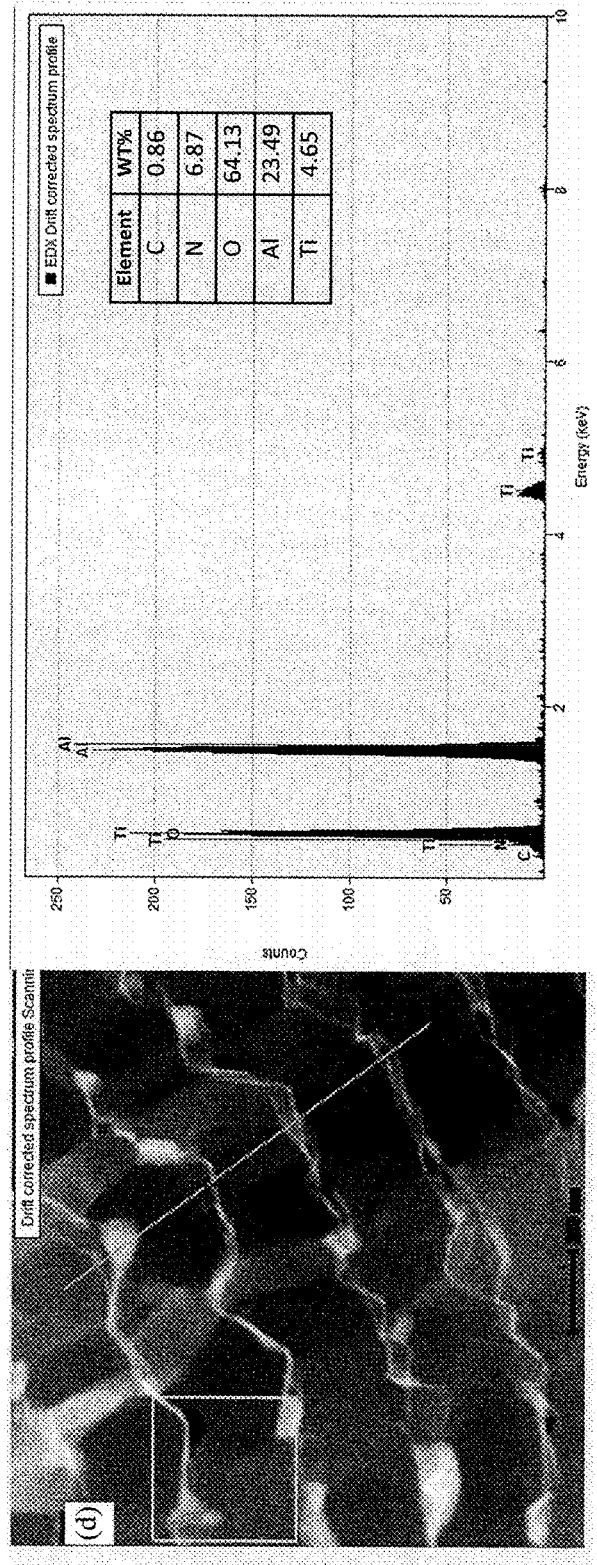

FIGS. 5(a)-(d) further illustrate compositional parameters of several structural features of a composite refractory layer described herein. FIG. 5(a) is an EDS line profile of a section of a nanocomposite refractory layer. As provided in FIG. 5(a), titanium content of the refractory layer is commensurate with locations of the reinforcing particulate phase and nanoscale ribbon structures. FIGS. 5(b) and 5(d) further confirm the presence of titanium at these reinforcement locations, whereas FIG. 5(c) illustrates the alumina composition of the matrix phase.

Figure 6:
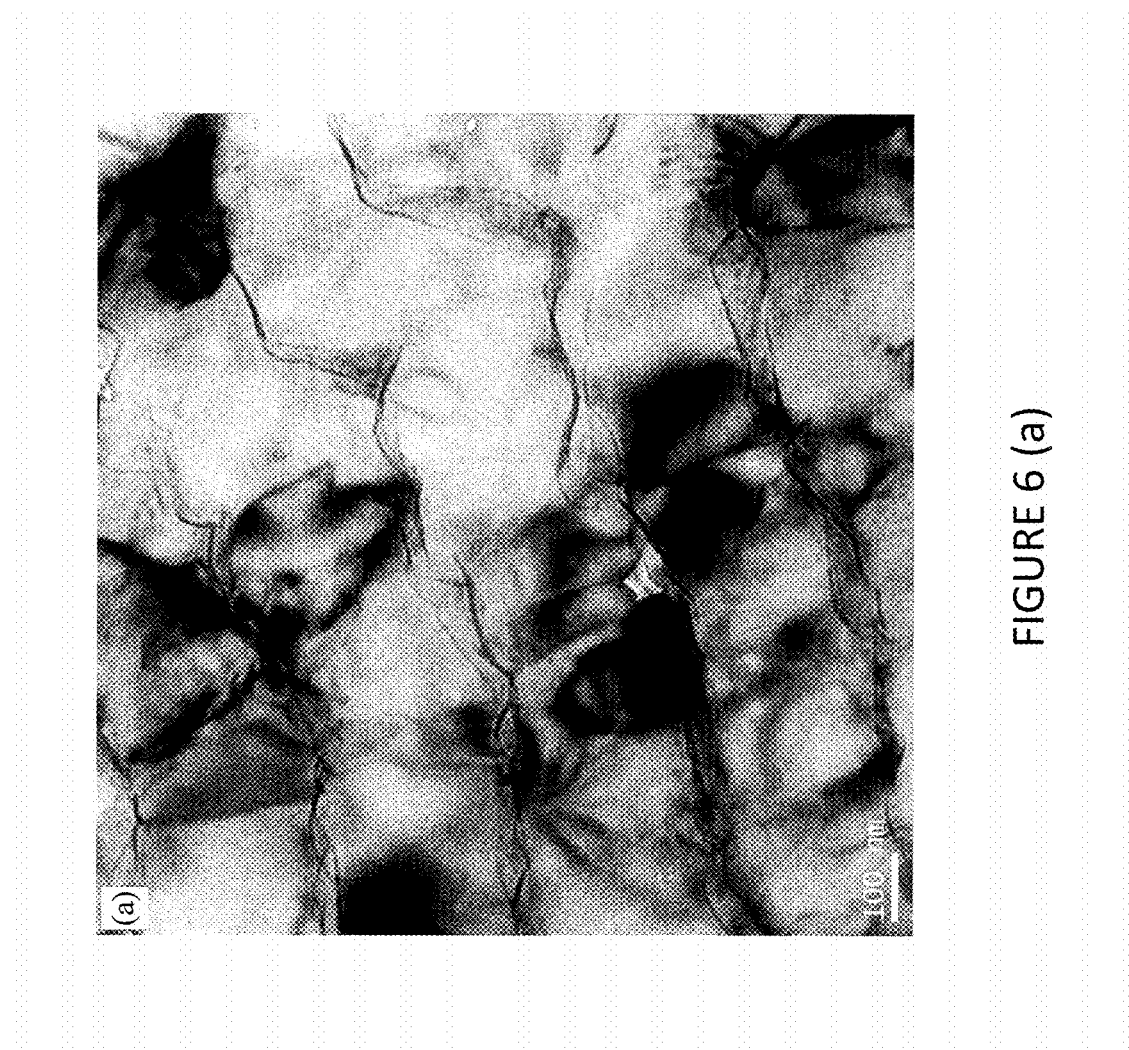
FIG. 6(a) is a bright field TEM image of a section of a composite refractory layer according to some embodiments described herein.
FIG. 6(b) is a STEM image of a section of a composite refractory layer according to some embodiments described herein.
Figure 6:
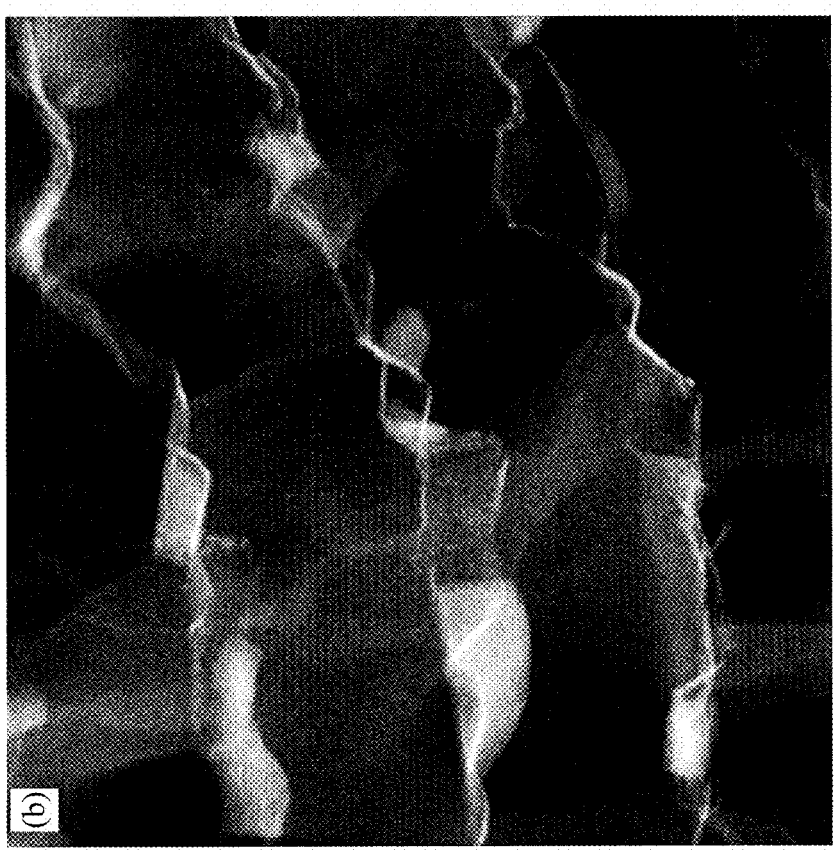

FIG. 6(a) is a bright field TEM image of a section of a composite refractory layer according to some embodiments described herein. FIG. 6(b) is a STEM image of a section of a composite refractory layer according to some embodiments described herein. Further, the presence and 2-dimensional morphologies of nanoscale ribbon structures in the alumina matrix are revealed.

The composite refractory layer having structure and composition described herein can have any thickness not inconsistent with the objectives of the present invention. For example, the composite refractory layer has thickness of 0.05 µm to 20 µm. In some embodiments, the composite refractory layer has thickness selected form Table III.

TABLE III

| Composite Refractory Layer Thickness (µm) |
| --- |
| 0.5-15 |
| 1-10 |
| 2-8 |

The composite refractory layer can be deposited directly on the substrate surface. Alternatively, a coating described herein can further comprise one or more inner layers between the composite refractory layer and the substrate. Inner layer(s), in some embodiments, comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. In some embodiments, one or more inner layers between the substrate and refractory layer comprise a carbide, nitride, carbonitride, oxycarbonitride, oxide or boride of one or more metallic elements selected from the group consisting of aluminum and metallic elements of Groups IVB, VB and VIB of the Periodic Table.

For example, one or more inner layers are selected from the group consisting of titanium nitride, titanium carbonitride, titanium oxycarbonitride, titanium carbide, zirconium nitride, zirconium carbonitride, hafnium nitride and hafnium carbonitride. Further, a layer of titanium oxycarbonitride can be employed as a bonding layer for the refractory layer and inner layers of the coating. Inner layer(s) of the coating can have any thickness not inconsistent with the objectives of the present invention. In some embodiments, a single inner layer can have a thickness of at least 1.5 µm. Alternatively, a plurality of inner layers can collectively achieve thickness of at least 1.5 µm.

The composite refractory layer can be the outermost layer of the coating. Alternatively, a coating described herein can comprise one or more outer layers over the refractory layer. Outer layer(s) can comprise one or more metallic elements selected from the group consisting of aluminum and metallic elements of Groups IVB, VB and VIB of the Periodic Table and one or more non-metallic elements selected from Groups IIIA, IVA, VA and VIA of the Periodic Table. Outer layer(s) over the refractory layer can comprise a carbide, nitride, carbonitride, oxycarbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium oxycarbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. A coating outer layer, in some embodiments, can have a thickness ranging from 0.2 µm to 5 µm.

Coatings described herein can be subjected to post-coat treatments. Coatings, for example, can be blasted with various wet and/or dry particle compositions. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting and steam blasting. Wet blasting, for example, is accomplished using a slurry of inorganic and/or ceramic particles, such as alumina, and water. The alumina particle slurry can be pneumatically projected at a surface of the coated cutting tool body to impinge on the surface of the coating. The alumina particles can generally range in size between about 20 µm and about 100 µm.

Blasting parameters include pressure, angle of impingement, distance to the part surface and duration. In some embodiments, angle of impingement can range from about 10 degrees to about 90 degrees, i.e., the particles impinge the coating surface at an angle ranging from about 10 degrees to about 90 degrees. Suitable pressures can range from 30-55 pounds per square inch (psi) at a distance to the coated surface of 1-6 inches. Further, duration of the blasting can generally range from 1-10 seconds or longer. Blasting can be generally administered over the surface area of the coating or can be applied to select locations such as in a workpiece contact area of the cutting tool. A workpiece contact area can be a honed region of the cutting tool.

In other embodiments, a coating is subjected to a polishing post-coat treatment. Polishing can be administered with paste of appropriate diamond or ceramic grit size. Grit size of the paste, in some embodiments, ranges from 1 μm to 10 μm. In one embodiment, a 5-10 μm diamond grit paste is used to polish the coating. Further, grit paste can be applied to the CVD coating by any apparatus not inconsistent with the objectives of the present invention, such as brushes. In one embodiment, for example, a flat brush is used to apply grit paste to the CVD coating in a workpiece contact area of the cutting tool.

A coating described herein can be blasted or polished for a time period sufficient to achieve a desired surface roughness ($R_a$) and/or other parameters such as reducing residual tensile stress in the coating. In some embodiments, a coating subjected to post-coat treatment has a surface roughness ($R_a$) selected from Table IV.

TABLE IV

| Post-Coat Surface Roughness ($R_a$) Coating Surface Roughness ($R_a$) - nm |
| --- |
| ≤500 |
| ≤250 |
| <200 |
| 10-250 |
| 50-175 |
| 25-150 |

Coating surface roughness can be determined by optical profilometry using WYKO® NT-Series Optical Profilers commercially available from Veeco Instruments, Inc. of Plainview, N.Y.

Further, a post-coat treatment, in some embodiments, does not remove one or more outer layers of the coating. In some embodiments, for example, a post-coat treatment does not remove an outer layer of TiN, TiCN and/or TiOCN. Alternatively, a post-coat treatment can remove or partially remove one or more outer layers, such as TiN, TiCN and TiOCN.

A coating described herein including a composite refractory layer having an alumina matrix phase and at least one particulate phase therein can have nanohardness of at least 25 GPa. In some embodiments, the coating has nanohardness of 30 GPa to 40 GPa. Coating nanohardness can be in the as-deposited state. Alternatively, the nanohardness can reflect a blasted or polished condition of the coating. Coating nanohardness values recited herein were determined from nano-indentation testing conducted with a Fischerscope HM2000 in accordance with ISO standard 14577 using a Vickers indenter. Indentation depth was set to 0.2 μm.

In addition to hardness, a coating described herein including a composite refractory layer can exhibit a nanohardness to Young's modulus ratio (H/E) greater than 0.05 or greater than 0.07. In some embodiments, the H/E ratio ranges from 0.07 to 0.15.

As described herein, the nanocomposite refractory layer is deposited by CVD. The alumina matrix can be deposited from a gaseous mixture of $AlCl_3$, $H_2$, $CO_2$, HCl and optionally $H_2S$. General CVD processing parameters for depositing the alumina matrix are provided in Table V.

TABLE V

| Alumina Matrix CVD Processing Parameters | | | | | | | | | |
| --- | --- | --- | --- | --- | --- | --- | --- | --- | --- |
| Process Step | $H_2$ vol. % | $AlCl_3$ vol. % | $CO_2$ vol. % | CO vol. % | $H_2S$ vol. % | HCl vol. % | Temperature ° C. | Pressure mbar | Time min. |
| $Al_2O_3$ | Bal. | 1-5 | 0.5-5 | — | 0.05-0.5 | 0.05-5 | 950-1050 | 50-120 | 10-500 |

The nanoscale to submicron particles of the particulate phase are deposited on alumina grains by pulsed introduction into the reactor of a gaseous mixture including reactants suitable for forming the particles. Importantly, each deposition of nanoscale to submicron particles can independent of any prior particle deposition. Therefore, gaseous reactants for particulate phase deposition can vary over the duration of refractory layer thickness. In some embodiments, the gaseous reactant mixture for particulate phase deposition includes $H_2$, $N_2$ (optional), HCl (optional), $CH_4$, CO, $AlCl_3$ (optional) and reactant containing Group IVB metal. In some embodiments, the reactant is metal chloride, such as $MCl_4$, wherein M is a Group IVB metal. General CVD processing parameters for particulate phase deposition are provided in Table VI.

TABLE VI

| CVD Processing Parameters for Particulate Phase | | | | | | | | | |
| --- | --- | --- | --- | --- | --- | --- | --- | --- | --- |
| Process Step | $H_2$ vol. % | $N_2$ vol. % | $MCl_4$* vol. % | $CH_4$ vol. % | $AlCl_3$ vol. % | CO vol. % | HCl vol. % | Temp. ° C. | Press. mbar | Time min |
| TiOxCyNz reinforcement* | Bal. | Opt. | 1-5 | 1-5 | Opt. | 0.05-1 | Opt. | 950-1050 | 50-120 | 2-200 |

*M = Group IVB metal

Deposition of the particulate phase can terminate alumina grain growth in some embodiments. In such embodiments, alumina grains are renucleated and grown by reintroduction of the reactant gas mixture of Table V. Termination and renucleation of alumina can refine alumina grains to the submicron or nanoscale size regime.

The refractory layer can be deposited directly on the substrate surface. Alternatively, a plurality of coating inner layers can reside between the substrate and refractory layer. General CVD deposition parameters for various inner layers are provided in Table VII.

TABLE VII

CVD Parameters for Inner layer Deposition

| Base Layer Composition | Gas Mixture | Temperature ° C. | Pressure mbar | Duration min. |
|---|---|---|---|---|
| TiN | $H_2$, $N_2$, $TiCl_4$ | 800-900 | 60-100 | 10-90 |
| MT-TiCN | $H_2$, $N_2$, $TiCl_4$, $CH_3CN$ | 750-900 | 65-100 | 50-400 |
| HT-TiCN | $H_2$, $N_2$, $TiCl_4$, $CH_4$ | 900-1050 | 60-160 | 30-200 |
| TiOCN | $H_2$, $N_2$, $TiCl_4$, $CH_4$, CO | 900-1050 | 200-550 | 30-70 |

The foregoing general CVD parameters for inner layer deposition, in some embodiments, can be applied for deposition of one or more outer layers over the refractory layer.

These and other embodiments are further illustrated in the following non-limiting examples.

Example 1—Coated Cutting Tools

Coated cutting tools described herein were produced by placing cemented tungsten carbide (WC—Co) cutting insert substrates [ANSI standard geometry CNMG432RN] into an axial flow hot-wall CVD reactor. The cutting inserts comprised 6 wt. % cobalt binder with the balance WC grains of size 1-5 μm. A coating including a composite refractory layer having a matrix phase comprising alumina and a particulate phase comprising nanoscale to submicron crystalline particles formed of TiOCN was deposited on the cutting inserts according to Tables VIII and IX. The composite refractory layer also included titanium-containing nanoscale ribbons. The particulate phase and nanoscale ribbons reinforcements were introduced into the alumina matrix by pulse cycles, such as 48 and 96 pulse cycles, as set forth in Table VIII. An outer layer of TiN was deposited over the nanocomposite refractory layer to complete the coating. Alternatively, if desired, an outer layer of TiOCN can be deposited over the nanocomposite refractory layer to complete the coating.

TABLE VIII

CVD Deposition of Coating

| Process Step | $H_2$ vol. % | $N_2$ vol. % | $TiCl_4$ vol. % | $CH_3CN$ vol. % | $CH_4$ vol. % | $AlCl_3$ vol. % | $CO_2$ vol. % | CO vol. % | HCl vol. % | $H_2S$ vol. % |
|---|---|---|---|---|---|---|---|---|---|---|
| TiN | Bal. | 18.40 | 0.95 | — | — | — | — | — | — | — |
| MT-TiCN | Bal. | 27.8 | 1.31 | 0.001 | — | — | — | — | 1.40 | — |
| HT-TiCN | Bal. | 16.69 | 0.76 | — | 3.70 | — | — | — | — | — |
| TiOCN | Bal. | 17.50 | 1.08 | — | 2.52 | — | — | 1.10 | 1.10 | — |
| $Al_2O_3$ | Bal. | — | — | — | — | 4.84 | 2.42 | — | 3.00 | 0.10 |
| TiOxCyNz reinforcement* | Bal. | 11.40 | 3.65 | — | 1.94 | — | — | 0.49 | Opt. | — |
| TiN (Outer Layer) | Bal. | 25.70 | 0.76 | | | | | | Opt. | |
| TiOCN** (Outer Layer) | Bal. | 38.00 | 0.99 | — | 2.6 | — | — | 1.12 | Opt. | — |

*Periodic introduction onto alumina layer to form TiOxCyNz reinforcement (48 and 96 introductions)
**Alternative outer layer

TABLE IX

CVD Deposition Steps

| Process Step | Temperature ° C. | Pressure mbar | Time min. |
|---|---|---|---|
| TiN | 850-960 | 60-90 | 10-90 |
| MT-TiCN | 900-940 | 70-100 | 50-400 |
| HT-TiCN | 900-1050 | 60-150 | 30-200 |
| TiOCN | 950-1050 | 200-500 | 30-70 |
| $Al_2O_3$ | 950-1050 | 50-120 | 10-500 |
| TiOxCyNz reinforcement* | 950-1050 | 50-120 | 2-200 |
| TiN (Outer Layer) | 850-960 | 60-90 | 10-90 |
| TiOCN (Outer Layer)** | 950-1050 | 200-500 | 30-180 |

*Periodic introduction onto alumina layer to form TiOxCyNz reinforcement.
**Alternative outer layer The resulting coatings exhibited the properties provided in Table X and XI.

TABLE X

Properties of 48-pulse Cycle Coating (Example 1a)

| Coating Layers | Thickness (μm) |
|---|---|
| TiN | 0.2 |
| MT-TiCN | 11.8 |
| HT-TiCN/TiOCN | 1.0 |
| $[Al_2O_3—TiOxCyNz]_{48}$ | 6.8 |
| TiN | 1.6 |

TABLE XI

Properties of 96-pulse Cycle Coating (Example 1b)

| Coating Layers | Thickness (μm) |
|---|---|
| TiN | 0.3 |
| MT-TiCN | 8.8 |
| HT-TiCN/TiOCN | 0.9 |
| $[Al_2O_3—TiOxCyNz]_{96}$ | 7.2 |
| TiOCN | 1.5 |

Example 2—Coating Hardness

The coated cutting tool of Example 1a was subjected to nanohardness testing. Nanohardness was also determined for a comparative cutting insert of identical ANSI geometry having a CVD coating detailed in Table XII (Comparative 1). Nanohardness was determined from nano-indentation testing conducted with a Fischerscope HM2000 in accordance with ISO standard 14577 using a Vickers indenter. Indentation depth was set to 0.2 µm.

TABLE XII

Properties of CVD Coating of Comparative 1

| Coating Layers | Thickness (µm) |
|---|---|
| TiN | 0.5 |
| MT-TiCN | 10.4 |
| HT-TiCN | 1.0 |
| $Al_2O_3$ | 8.4 |
| TiN | 1.6 |

Example 1a and Comparative 1 were in the as-deposited state. The results of the testing are provided in Table XIII.

TABLE XIII

Nanohardness and H/E Results

| Cutting Insert | Nanohardness (GPa) | H/E |
|---|---|---|
| Example 1a | 34.2 | 0.09 |
| Comparative 1 | 27.9 | 0.07 |

Example 3—Metal Cutting Testing

Coated cutting inserts of Examples 1a, 1b and Comparative 1 were subjected to continuous turning testing according to the parameters below. Coatings of Examples 1a and 1b were subjected to post-coat treatment as detailed in Table XIV.

TABLE XIV

Coated Inserts for Turning Testing

| Cutting Insert | Coating Architecture | Post-Coat Treatment |
|---|---|---|
| 1 | Example 1a | Wet blasting at 40 psi for 4 sec. to fully remove outer layer |
| 2 | Example 1a | Wet blasting at 40 psi for 3 sec. |
| 3 | Example 1b | Wet blasting at 40 psi for 3 sec. |
| 4 | Comparative 1 | Wet blasting at 40 psi for 4 sec. to fully remove outer layer |

For the turning testing, two samples of each cutting insert 1-4 were tested to generate repetition 1, repetition 2 and mean cutting lifetimes.
Turning Parameters
Workpiece: 1045 Steel
Speed: 1000 sfm
Feed Rate: 0.012 ipr
Depth of Cut: 0.08 in
Lead Angle: −5°
Coolant—Flood
End of Life was registered by one or more failure modes of:
Uniform Wear (UW) of 0.012 inches
Max Wear (MW) of 0.012 inches
Nose Wear (NW) of 0.012 inches
Depth of Cut Notch Wear (DOCN) of 0.012 inches
Trailing Edge Wear (TW) of 0.012 inches The results of the continuous turning testing are provided in Table XV.

TABLE XV

Continuous Turning Testing Results

| CVD Coated Cutting Insert | CVD Coating Architecture | Repetition 1 Lifetime min. | Repetition 2 Lifetime min. | Mean Cutting Lifetime min. | Relative Tool Life vs. Comparative 1 |
|---|---|---|---|---|---|
| 1 | Example 1a | 21.8 | 19.0 | 20.4 | 109% |
| 2 | Example 1a | 21.8 | 21.0 | 21.4 | 116% |
| 3 | Example 1b | 18.8 | 18.8 | 18.8 | 101% |
| 4 | Comparative 1 | 19.6 | 17.8 | 18.7 | — |

As provided in Table XV, cutting insert employing CVD coating architectures described herein exceed the performance of the industry standard alumina coating of Comparative 1.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated article comprising:
   a substrate; and
   a coating deposited by chemical vapor deposition (CVD) adhered to the substrate, the coating including a refractory layer having a matrix phase comprising alumina and at least one particulate phase within the matrix phase, the particulate phase comprising nanoscale to submicron particles formed of at least one of an oxycarbide and oxycarbonitride of one or more metals selected from the group consisting of aluminum and Group IVB metals, wherein alumina grains of the matrix phase are columnar.

2. The coated article of claim 1, wherein the refractory layer further comprises titanium-containing nanoscale ribbon structures within the matrix phase.

3. The coated article of claim 1, wherein the particles have a size of 5 nm to 800 nm.

4. The coated article of claim 1, wherein the particles are crystalline.

5. The coated article of claim 2, wherein the titanium-containing nanoscale ribbon structures have at least one dimension ranging from 1 nm to 100 nm.

6. The coated article of claim 2, wherein the titanium-containing nanoscale ribbon structures exhibit a 2-dimensional structure.

7. The coated article of claim 1, wherein the particles have periodic or patterned spacing in the matrix phase.

8. The coated article of claim 7, wherein the periodic spacing ranges from 20 nm to 2 µm.

9. The coated article of claim 1, wherein the particles are substantially uniformly distributed in the matrix phase.

10. The coated article of claim 1, wherein alumina of the matrix phase further comprises Group IVB metal dopant.

11. The coated article of claim 1, wherein composition of the particles varies with thickness of the refractory layer.

12. The coated article of claim 1, wherein the Group IVB metal is titanium.

13. The coated article of claim 1, wherein the CVD coating has nanohardness of at least 25 GPa.

14. The coated article of claim 1, wherein the CVD coating has nanohardness of 30-40 GPa.

15. The coated article of claim 1, wherein the CVD coating has a nanohardness to Young's modulus ratio (H/E) greater than 0.05.

16. The coated article of claim 15, wherein the H/E ratio is greater than 0.07.

17. The coated article of claim 1, wherein the refractory layer has thickness of 0.05 µm to 20 µm.

18. The coated article of claim 1 further comprising one or more inner layers between the refractory layer and the substrate, an inner layer comprising one or more metallic elements selected from the group consisting of aluminum and metallic elements of Groups IVB, VB and VIB of the Periodic Table and one or more non-metallic elements of Groups IIIA, IVA, VA and VIA of the Periodic Table.

19. The coated article of claim 1 further comprising one or more outer layers over the refractory layer and the substrate, an outer layer comprising one or more metallic elements selected from the group consisting of aluminum and metallic elements of Groups IVB, VB and VIB of the Periodic Table and one or more non-metallic elements of Groups IIIA, IVA, VA and VIA of the Periodic Table.

20. The coated article of claim 1, wherein the substrate is cemented carbide, carbide, cermet, steel or polycrystalline cubic boron nitride.

21. A coated article comprising:
a substrate; and
a coating deposited by chemical vapor deposition (CVD) adhered to the substrate, the coating including a refractory layer having a matrix phase comprising alumina and at least one particulate phase within the matrix phase, the particulate phase comprising nanoscale to submicron particles formed of at least one of an oxycarbide and oxycarbonitride of one or more metals selected from the group consisting of aluminum and Group IVB metals, wherein the CVD coating has nanohardness of at least 25 GPa.

22. The coated article of claim 21, wherein the CVD coating has nanohardness of 30-40 GPa.

23. The coated article of claim 21, wherein the refractory layer further comprises titanium-containing nanoscale ribbon structures within the matrix phase.

24. The coated article of claim 21, wherein the substrate is cemented carbide, carbide, cermet, steel or polycrystalline cubic boron nitride.

25. The coated article of claim 21, wherein alumina of the matrix phase further comprises Group IVB metal dopant.

26. The coated article of claim 21, wherein the CVD coating has a nanohardness to Young's modulus ratio (H/E) greater than 0.05.

27. The coated article of claim 21, wherein alumina of the matrix phase further comprises Group IVB metal dopant.

28. A coated article comprising:
a substrate; and
a coating deposited by chemical vapor deposition (CVD) adhered to the substrate, the coating including a refractory layer having a matrix phase comprising alumina and at least one particulate phase within the matrix phase, the particulate phase comprising nanoscale to submicron particles formed of at least one of an oxycarbide and oxycarbonitride of one or more metals selected from the group consisting of aluminum and Group IVB metals, wherein the refractory layer further comprises titanium-containing nanoscale ribbon structures within the matrix phase, the titanium-containing nanoscale ribbon structures exhibiting a 2-dimensional structure.

29. The coated article of claim 28, wherein the titanium-containing nanoscale ribbon structures have at least one dimension ranging from 1 nm to 100 nm.

30. The coated article of claim 28, wherein the CVD coating has a nanohardness to Young's modulus ratio (H/E) greater than 0.05.

* * * * *